US010698548B2

(12) United States Patent
Li

(10) Patent No.: US 10,698,548 B2
(45) Date of Patent: Jun. 30, 2020

(54) TOUCH PANEL AND ORGANIC LIGHT EMITTING DIODE DISPLAY PANEL

(71) Applicant: Wuhan China Star Optoelectronics Semiconductor Display Technology Co., Ltd., Wuhan, Hubei (CN)

(72) Inventor: Bo Li, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/232,969

(22) Filed: Dec. 26, 2018

(65) Prior Publication Data

US 2020/0042117 A1 Feb. 6, 2020

Related U.S. Application Data

(63) Continuation of application No. PCT/CN2018/105636, filed on Sep. 14, 2018.

(30) Foreign Application Priority Data

Aug. 6, 2018 (CN) .......................... 2018 1 0883765

(51) Int. Cl.
*G06F 3/044* (2006.01)
*G06F 3/041* (2006.01)
*H01L 27/32* (2006.01)

(52) U.S. Cl.
CPC ............ *G06F 3/044* (2013.01); *G06F 3/0412* (2013.01); *H01L 27/323* (2013.01); *G06F 2203/04102* (2013.01); *G06F 2203/04111* (2013.01)

(58) Field of Classification Search
CPC ...... G06F 3/044; G06F 3/0443; G06F 3/0444; G06F 3/0445; G06F 3/0446; G06F 3/0412; G06F 2203/04102; G06F 2203/04111; H01L 27/323; H01L 51/5253; H01L 2251/5338
See application file for complete search history.

(56) References Cited

U.S. PATENT DOCUMENTS

| 2016/0085339 | A1* | 3/2016 | Yashiro | ................... G06F 3/044 345/174 |
| 2018/0059843 | A1* | 3/2018 | Kim | ....................... G06F 3/044 |
| 2018/0095566 | A1* | 4/2018 | Lee | ....................... G06F 3/0412 |

(Continued)

FOREIGN PATENT DOCUMENTS

| CN | 103777810 A | 5/2014 |
| CN | 104808853 A | 7/2015 |
| CN | 108054193 A | 5/2018 |

*Primary Examiner* — Tom V Sheng
(74) *Attorney, Agent, or Firm* — Leong C. Lei

(57) ABSTRACT

Disclosed are a touch panel and a corresponding organic light emitting diode display panel. A metal grid touch line is fabricated on an encapsulation layer of a flexible organic light emitting diode display panel, and is not positioned in a light emitting area of a pixel point, and traced in a middle of adjacent pixel points. At least one electrode of a driving electrode and a sensing electrode is conducted with a metal grid bridge (bridge metal) thereunder, to realize a flexible touch panel and to reduce a thickness of a film by reducing use of transparent optical adhesive.

18 Claims, 7 Drawing Sheets

(56) References Cited

U.S. PATENT DOCUMENTS

| | | | |
|---|---|---|---|
| 2018/0095577 A1* | 4/2018 | Han | G06F 3/0412 |
| 2018/0113345 A1* | 4/2018 | Song | G02F 1/13338 |
| 2018/0120997 A1* | 5/2018 | Moon | G06F 3/0412 |
| 2018/0122867 A1* | 5/2018 | Choe | G06F 3/0412 |
| 2019/0004638 A1* | 1/2019 | Lee | G06F 3/047 |
| 2019/0056816 A1* | 2/2019 | Hsu | G06F 3/044 |
| 2019/0204952 A1* | 7/2019 | Han | G06F 3/0412 |
| 2019/0204964 A1* | 7/2019 | Wang | G06F 3/0446 |
| 2019/0302934 A1* | 10/2019 | Rhe | G06F 3/047 |
| 2019/0317631 A1* | 10/2019 | Feng | G06F 3/0412 |

* cited by examiner

TOUCH PANEL AND ORGANIC LIGHT EMITTING DIODE DISPLAY PANEL

CROSS-REFERENCE TO RELATED APPLICATION

This application is a continuing application of PCT Patent Application No. PCT/CN2018/105636 entitled "Touch panel and organic light emitting diode display panel", filed on Sep. 14, 2018, which claims priority to Chinese Patent Application No. 201810883765.2 filed on Aug. 6, 2018, both of which are hereby incorporated in its entireties by reference.

FIELD OF THE INVENTION

The present invention relates to a display technology field, and more particularly to a touch panel and an organic light emitting diode display panel.

BACKGROUND OF THE INVENTION

In recent years, the rapid development of active matrix organic light emitting diode display (AMOLED) technology has promoted the rapid entry of curved surface and flexible display touch products into the market, and respective panel manufacturers have invested in flexible display touch projects. At present, the touch technology with the AMOLED display panel mainly has an external touch film (Film) bonding solution and a glass packaged rigid On-Cell technology (it means embedding the touch panel between the color filter substrate and the polarizer of the display panel). Either in the external film or the glass On-Cell touch technology, there is a thickness increasing problem of the product which affects the narrow frame design.

FIG. 1 shows a structural diagram of an organic light emitting diode display panel using an external touch film bonding solution in the prior art. The OLED display panel includes: a substrate 1', an OLED layer 2', a packaged layer 3', a first transparent optical adhesive layer 4', a touch thin film layer 5', a polarizer 6', a second transparent optical adhesive layer 7' and a cover plate glass layer 8' from bottom to top in sequence. The transparent optical adhesive bonds the touch film and the OLED layer, and meanwhile, the polarizer and the cover plate glass are bonded with the transparent optical adhesive. Since the bonding times are twice, and the bonding tolerance is generally 0.1 mm or more. The external touch film bonding solution increases the thickness of the product and is not beneficial to the narrow frame design products.

FIG. 2 shows a structural diagram of an organic light emitting diode display panel using a glass packaged On-Cell touch technology in the prior art. In the figure, the OLED display panel includes: a substrate 10', and OLED layer 20', a packaged glass layer 30', a touch control line layer 40', a polarizer 50', a transparent optical adhesive layer 60' and a cover plate glass layer 70'. The touch sensing line is fabricated on the packaged glass of the display panel. Then, the surface with the packaged glass is attached with the OLED panel with the transparent optical adhesive without separately attaching the external touch film. However, this structure is only suitable for the production of rigid AMOLED display panels, and the overall thickness of the product is thick, which is not suitable for the development direction of the current product being light and thin and flexible.

SUMMARY OF THE INVENTION

An objective of the present invention is to provide a touch panel and an organic light emitting diode display panel, which can realize a flexible touch panel and can reduce a thickness of the organic light emitting diode display panel.

For solving the aforesaid issue, the embodiment of the present invention provides a touch panel, comprising:

a plurality of first touch electrode strings arranged in a first direction, wherein each of the first touch electrode strings comprises a plurality of first grid electrodes which are electrically connected;

a plurality of second touch electrode strings in a same layer that intersect with the plurality of first touch electrode strings arranged in a second direction, wherein each of the second touch electrode strings comprises a plurality of second grid electrodes;

an insulating layer disposed on one side of the first touch electrode string and the second touch electrode string;

a bridge metal layer comprising at least one metal bridge;

wherein one side of the insulating layer is in contact with the first touch electrode string and the second touch electrode string, and an other side of the insulating layer is in contact with the bridge metal layer, and two adjacent second grid electrodes of the second touch electrode string are connected with the metal bridge with through holes disposed in the insulating layer.

The first grid electrode comprises a plurality of first metal lines, and the second grid electrode comprises a plurality of second metal lines;

adjacent edges of the first grid electrode and the second grid electrode are staggered, and an electrical separation between the first touch electrode string and the second touch electrode string is achieved by a slight break between the first metal line and the adjacent second metal line.

The metal bridge is a metal grid bridge formed by at least one third metal wire, and the metal grid bridge is linear, X-shaped or double X-shaped as a whole.

Two ends of the metal bridge are respectively provided with a connecting portion, and the connecting portions are electrically connected to two adjacent second grid electrodes with the through holes provided in the insulating layer, respectively, and the connecting portions of the two ends of the metal bridge is thicker than adjacent third metal lines.

Staggered edges of the first touch electrode string and the second touch electrode string possess a pulsed edge or a zigzag edge.

The first touch electrode string and the second touch electrode string are made of titanium aluminum titanium three-layer composite metal, and the metal bridge is made of titanium aluminum titanium three-layer composite metal or molybdenum aluminum molybdenum three-layer composite metal.

The first grid electrode is one of a driving electrode and a sensing electrode, and the second grid electrode is an other of the driving electrode and the sensing electrode.

The first metal line, the second metal line and the third metal line are all traced along a middle of adjacent pixel points, and widths thereof are all within a range of 0.5 μm to 5 μm.

A diameter of the through hole does not exceed a distance of adjacent pixel points.

Correspondingly, the present invention also provides an organic light emitting diode display panel, which comprises a substrate, an organic light emitting diode layer disposed on the substrate and an encapsulation layer disposed above the organic light emitting diode layer, further comprising:

a touch panel disposed on the encapsulation layer;
a protective layer disposed on the touch panel;
wherein the touch panel comprises:

a plurality of first touch electrode strings arranged in a first direction, wherein each of the first touch electrode strings comprises a plurality of first grid electrodes which are electrically connected;

a plurality of second touch electrode strings in a same layer that intersect with the plurality of first touch electrode strings arranged in a second direction, wherein each of the second touch electrode strings comprises a plurality of second grid electrodes;

an insulating layer disposed on one side of the first touch electrode string and the second touch electrode string;

a bridge metal layer comprising at least one metal bridge;

wherein one side of the insulating layer is in contact with the first touch electrode string and the second touch electrode string, and an other side of the insulating layer is in contact with the bridge metal layer, and two adjacent second grid electrodes of the second touch electrode string are connected with the metal bridge with through holes disposed in the insulating layer.

The first grid electrode comprises a plurality of first metal lines, and the second grid electrode comprises a plurality of second metal lines;

adjacent edges of the first grid electrode and the second grid electrode are staggered, and an electrical separation between the first touch electrode string and the second touch electrode string is achieved by a slight break between the first metal line and the adjacent second metal line.

The metal bridge is a metal grid bridge formed by at least one third metal wire, and the metal grid bridge is linear, X-shaped or double X-shaped as a whole.

Two ends of the metal bridge are respectively provided with a connecting portion, and the connecting portions are electrically connected to two adjacent second grid electrodes with the through holes provided in the insulating layer, respectively, and the connecting portions of the two ends of the metal bridge is thicker than adjacent third metal lines.

Staggered edges of the first touch electrode string and the second touch electrode string possess a pulsed edge or a zigzag edge.

The first touch electrode string and the second touch electrode string are made of titanium aluminum titanium three-layer composite metal, and the metal bridge is made of titanium aluminum titanium three-layer composite metal or molybdenum aluminum molybdenum three-layer composite metal.

The first grid electrode is one of a driving electrode and a sensing electrode, and the second grid electrode is an other of the driving electrode and the sensing electrode.

The first metal line, the second metal line and the third metal line are all traced along a middle of adjacent pixel points, and widths thereof are all within a range of 0.5 μm to 5 μm.

A diameter of the through hole does not exceed a distance of adjacent pixel points.

With implementing the embodiments of the present invention, the benefits are:

the touch panel and the organic light emitting diode display panel provided by the present invention can realize the On-Cell touch scheme of the flexible display touch control by forming the metal grid touch sensing line on the thin film encapsulation layer of the flexible organic light emitting diode display panel;

moreover, since the metal grid is used as the touch sensing circuit, the product can possess good bending resistance characteristics, and the metal grid lines are traced in the middle of adjacent pixel points, thereby minimizing the optical influence of the touch sensor on the organic light emitting diode;

meanwhile, since the lamination number of touch panel is effectively reduced, the thickness of the product can be effectively reduced while achieving flexible display touch control, and the production cost of the product is also reduced.

BRIEF DESCRIPTION OF THE DRAWINGS

In order to more clearly illustrate the embodiments of the present invention or the prior art, the following figures will be described in the embodiments or the prior art are briefly introduced. It is obvious that the drawings are only some embodiments of the present invention, those of ordinary skill in this field can obtain other figures according to these figures without paying the premise.

DETAILED DESCRIPTION OF PREFERRED EMBODIMENTS

Figure 1:
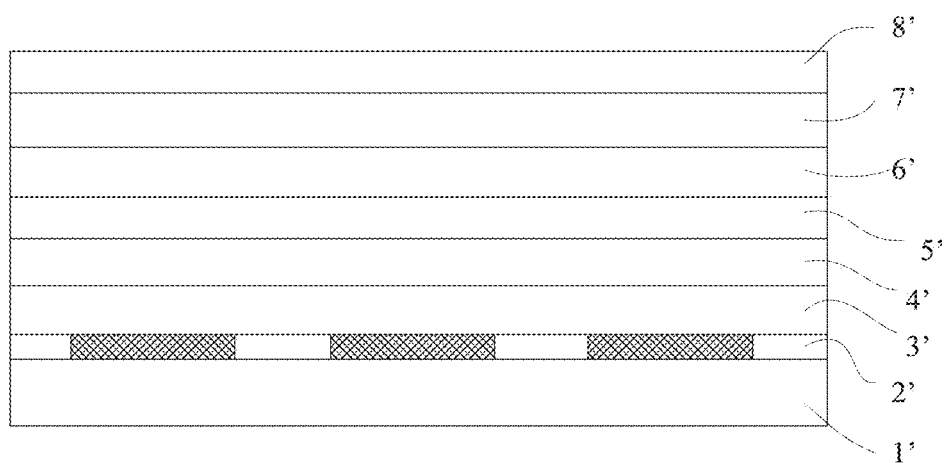
FIG. 1 is a structural diagram of an organic light emitting diode display panel using an external touch film bonding solution in the prior art.
Figure 2:
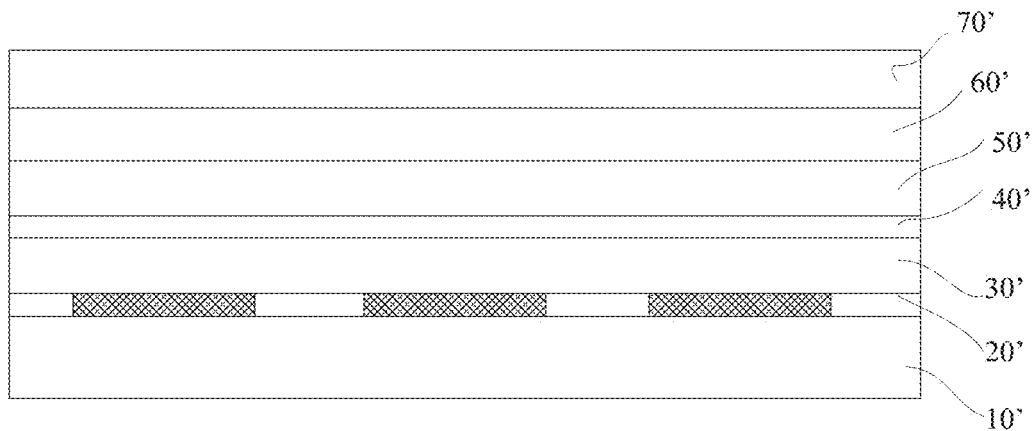
FIG. 2 is a structural diagram of an organic light emitting diode display panel using a glass package On-Cell touch technology in the prior art.

Embodiments of the present invention are described in detail with the technical matters, structural features; achieved objects; and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Here, it should also be noted that, in order to avoid obscuring the present invention due to unnecessary details, only the structures and/or processing steps closely related to the solution according to the present invention are shown in the drawings, and other details that are not relevant to the present invention are omitted.

Figure 3:
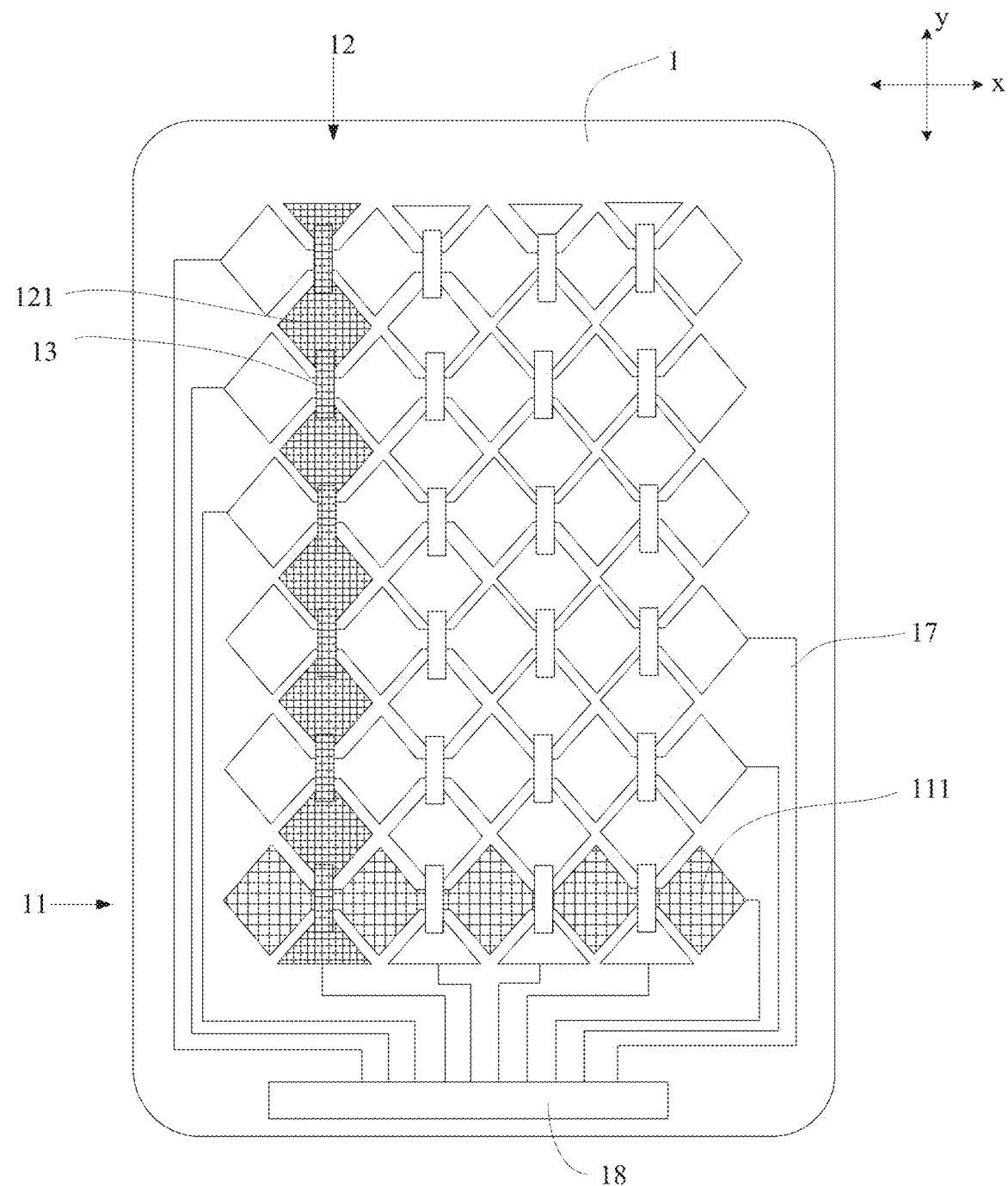
FIG. 3 is a structural diagram of one embodiment of a touch panel according to the present invention.
Figure 4:
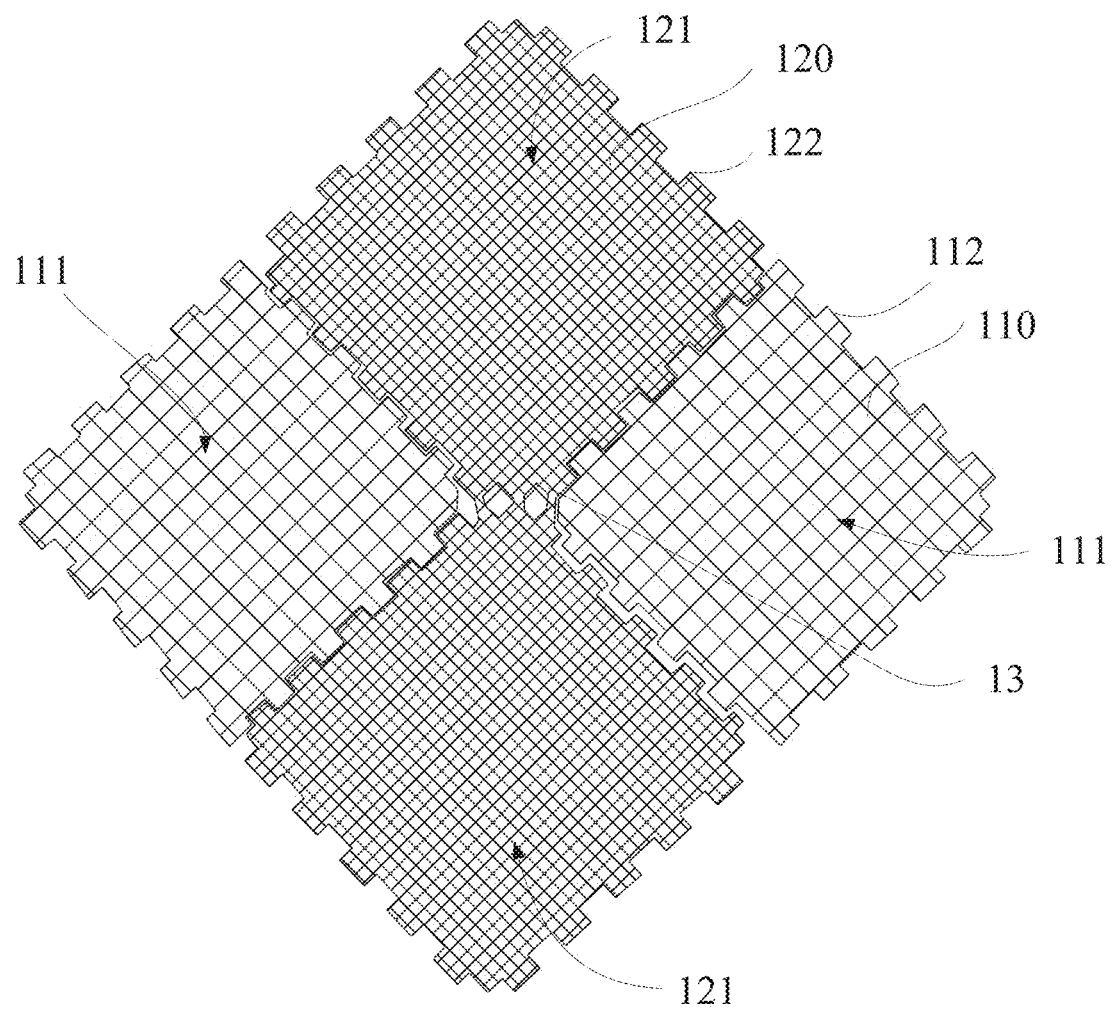
FIG. 4 is a structural diagram of one embodiment of an intersection of a first touch electrode string and a second touch electrode string in FIG. 3 with more details.
Figure 5:
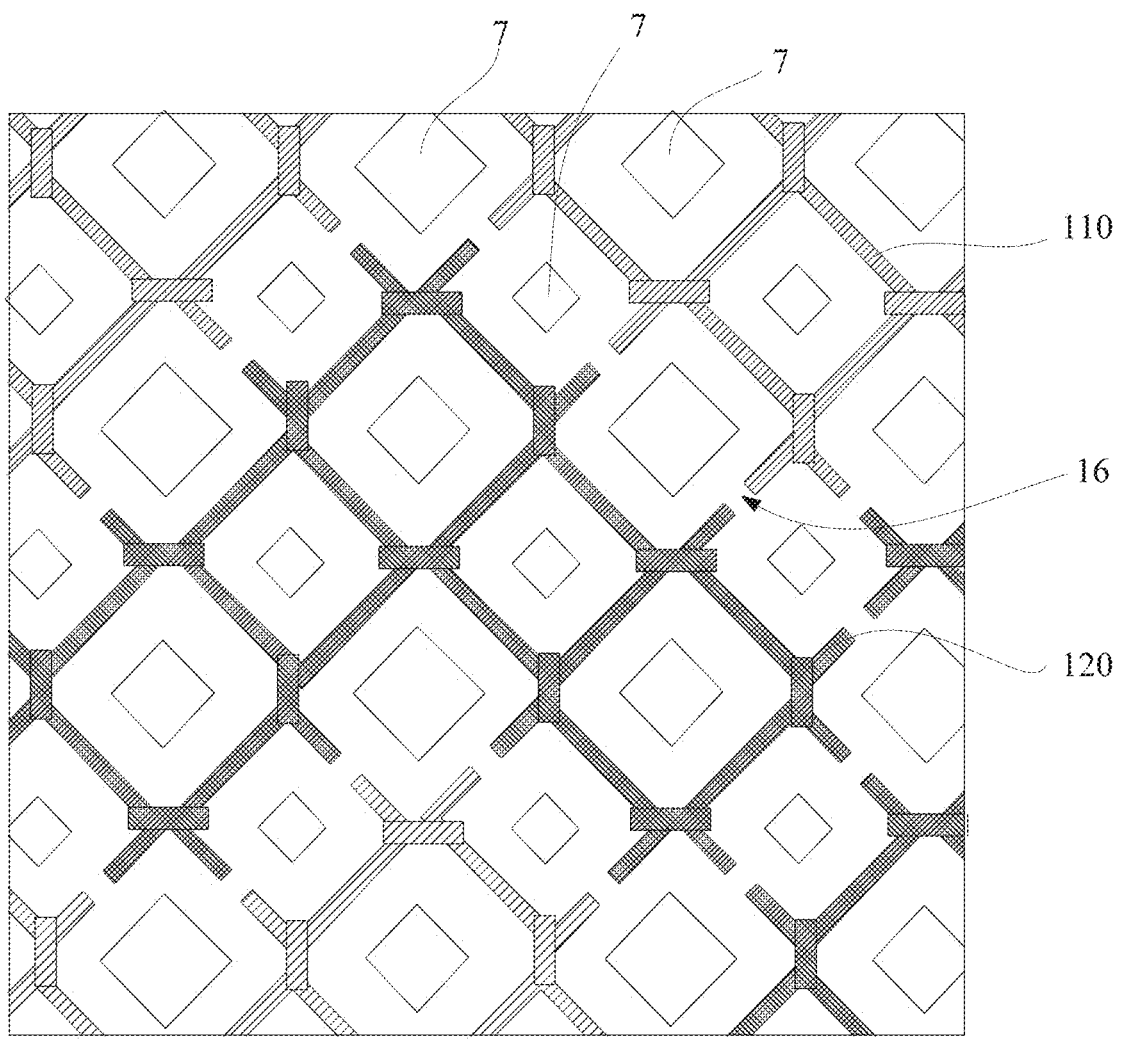
FIG. 5 is a structural diagram of an adjacent area of the first touch electrode string and the second touch electrode string in FIG. 4 with more details.
Figure 6:
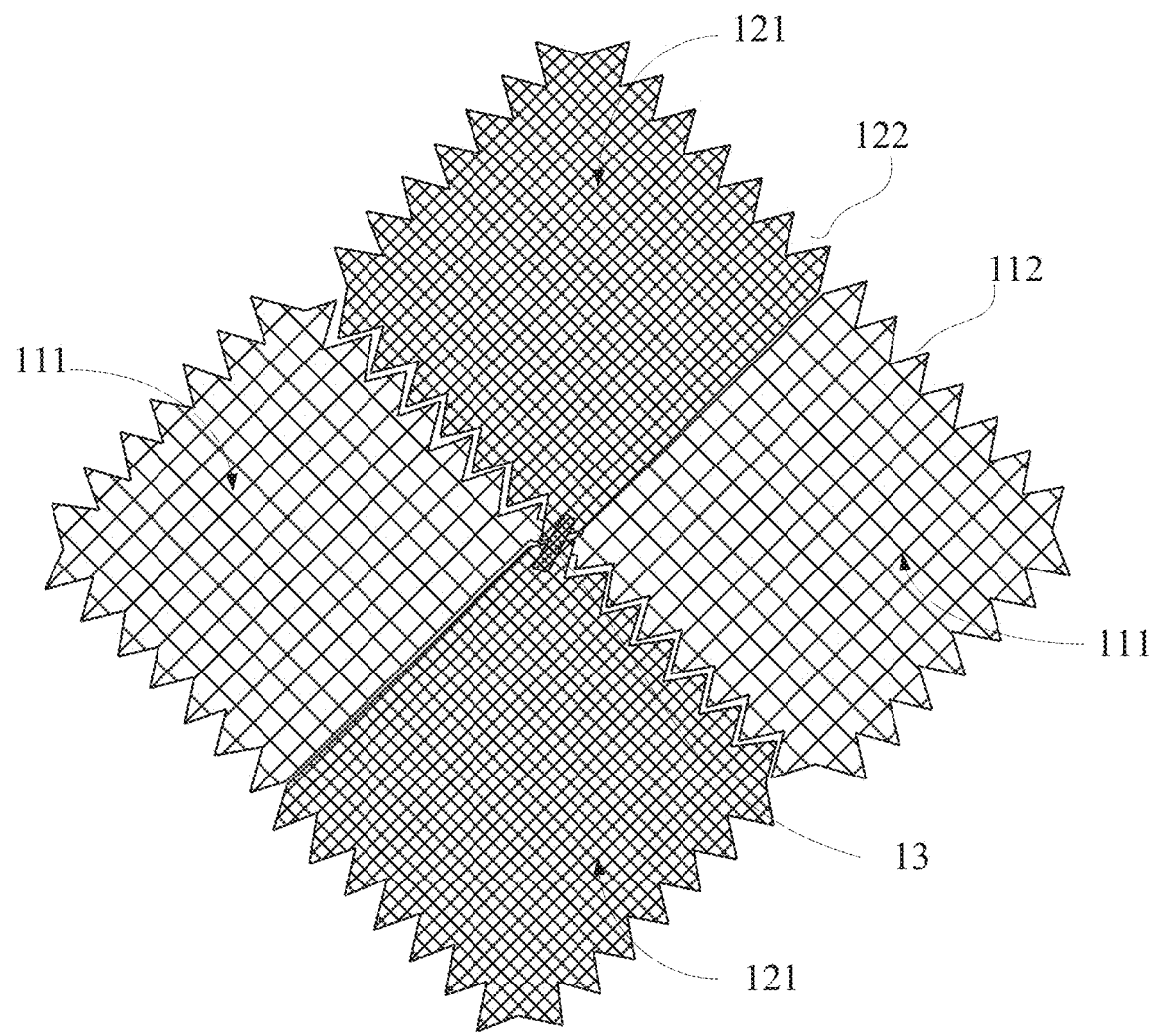
FIG. 6 is a structural diagram of another embodiment of an intersection of the first touch electrode string and the second touch electrode string in FIG. 3 with more details.

FIG. 3 shows a structural diagram of one embodiment of a touch panel according to the present invention. As shown in FIG. 4 to FIG. 10, in this embodiment, the touch panel 1 includes:

a plurality of first touch electrode strings 11 arranged in a first direction (such as X direction), wherein each first touch electrode string 11 in the plurality of first touch electrode strings includes a first grid electrode 111 formed by intersection of a plurality of first metal lines 110, and namely, each first touch electrode string 11 includes a plurality of first grid electrodes 111; and adjacent first grid electrodes are electrically connected by the first metal line 110, and the first metal line 110 is traced along the middle of adjacent pixel points 7, that is, the pixel point 7 is located in the grid; so that the grid lines do not block a light-emitting area of the pixel point 7;

a plurality of second touch electrode strings 12 in a same layer that intersect with the plurality of first touch electrode strings 11 arranged in a second direction (such as Y direction), wherein each of the second touch electrode strings 12 includes a second grid electrode 121 formed by intersection of a plurality of second metal lines 120; and the second metal line 120 is traced along the middle of adjacent pixel points; in FIG. 3, for convenience to view, the view angle is the top view angle of the metal grid touch panel, and thus the metal bridge 13 is at the upmost layer, and the view angles of FIG. 4 to FIG. 6 in the following are similar; and an insulating layer 14 disposed on one side of the first touch electrode string 11 and the second touch electrode string 12;

a bridge metal layer comprising at least one metal bridge 13;

wherein one side of the insulating layer 14 is in contact with the first touch electrode string 11 and the second touch electrode string 12, and an other side of the insulating layer 14 is in contact with the bridge metal layer, and two adjacent second grid electrodes 121 of the second touch electrode string 12 are connected with the metal bridge 13 with through holes disposed in the insulating layer, i.e. the two adjacent second grid electrodes 121 are electrically connected by the metal bridge 13.

Adjacent edges of the first grid electrode 111 and the second grid electrode 121 are staggered, and an electrical separation between the first touch electrode string 11 and the second touch electrode string 12 is achieved by a slight break 16 between the first metal line 110 and the adjacent second metal line 120. In some embodiments, a distance of the slight break 16 is within a range of 3 μm to 20 μm.

Two ends of the metal bridge 13 are electrically connected to two adjacent second grid electrodes 121 with the through holes provided in the insulating layer 14. In general, a diameter of the through hole does not exceed a distance of adjacent pixel points. For instance, in some embodiments, the diameter of the through hole is less than 15 μm.

Each of the first touch electrode strings 11 and each of the second touch electrode strings 12 are connected with a trace 17 extending to a bonding area 18 of the touch panel; it can be understood that numbers of the first grid electrode 111 and the second grid electrode 121 in FIG. 3 are merely illustrative but not limited thereto.

As shown in FIG. 4, staggered edges of each first touch electrode string 11 and each second touch electrode string 12 possess a pulsed edge; it can be understood that in other embodiments, different staggered manners can be used. For instance, in the other embodiment shown in FIG. 1, the staggered edges of the first touch electrode string 11 and the second touch electrode string 12 possess a zigzag edge, which can increase a contact area between the first grid electrode 111 and the second grid electrode 121 to enhance a mutual capacitance signal. Meanwhile, the shape difference of the grids in the first touch electrode string 11 and the second touch electrode string 12 shown in FIG. 4 is only for convenience of distinction, and is not limited. In the actual product, the same grid shape can be adopted in the first touch electrode strings 11 and the second touch electrode strings 12, which can be specifically referred to the embodiment in FIG. 5.

Figure 7:
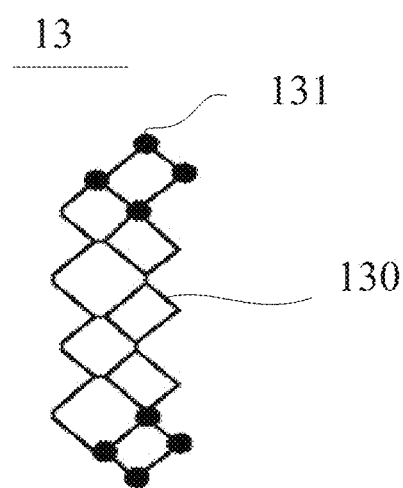
FIG. 7 is a structural diagram of one embodiment of a third metal line in FIG. 3.
Figure 8:
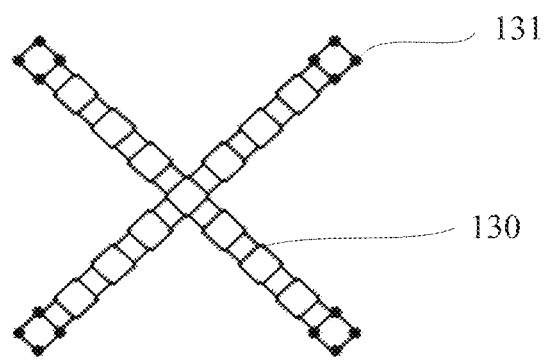
FIG. 8 is a structural diagram of another embodiment of a third metal line in FIG. 3.
Figure 9:
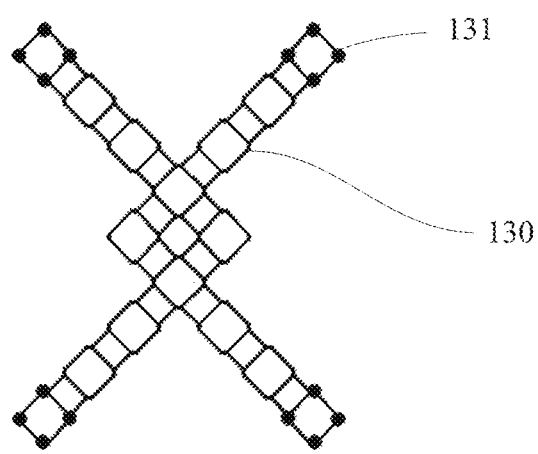
FIG. 9 is a structural diagram of one another embodiment of a third metal line in FIG. 3.

It can be understood that in other embodiments of the present invention, the metal bridge 13 is a metal grid bridge formed by at least one third metal line 130. As shown in FIGS. 7 to 9, the shapes of the three metal grid bridges are shown. The metal grid bridge shown in FIG. 7 is an overall linear (bar) metal grid bridge formed by a plurality of third metal lines 130 (e.g., three thirds metal lines). The black dot 131 is a connecting portion electrically connected to the second touch electrode string 12 with the through hole. In order to improve the connection effect, the connecting portions at the two ends of the metal bridge 13 are thicker than the adjacent third metal lines 130. It can be understood that the impedance of the metal grid bridge can be effectively reduced by using the plurality of third metal wires 130. In other embodiments, the metal bridges 13 of other shapes can also be used. FIG. 8 and FIG. 9 respectively show a X-shaped metal grid bridge and a double X-shaped metal grid bridge as a whole formed by a plurality of third metal lines 130; wherein the use of the smaller X-shaped metal grid bridge can reduce an area of a bridge region and prevent a risk of optical interference caused by excessive bridge region; the use of the double X-shaped metal grid bridge reduces the impedance while maintaining a small metal grid bridge, thereby reducing the probability of poor conduction. Meanwhile, the third metal lines 130 are traced along a middle of adjacent pixel points 7.

The first grid electrode 111 is one of a driving electrode and a sensing electrode, and the second grid electrode 121 is an other of the driving electrode and the sensing electrode. The driving electrode is used for inputting a driving signal, and the sensing electrode is for receiving a detecting signal. As performing touch detection, a mutual capacitance change at the intersection of the two conductive lines or a self-capacitance change of each conductive line are detected, that is, a self-capacitance or a mutual capacitance are employed to get a location of the touch point. If the coordinate system is established in the first direction X and the second direction Y, the obtained touch point position can be represented by the coordinate system. Generally, the first direction X and the second direction Y are generally defined as being perpendicular to each other. In order to make capacitance detection easier, a coordinate positioning is also more convenient. When the touch screen 1 is in another form (circular, irregular shape, or curved shape), the first direction X and the second direction Y may also be set to be non-perpendicularly intersected.

In more specific illustrations, the first touch electrode string 11 and the second touch electrode string 12 are made of titanium aluminum titanium three-layer composite metal, and the metal bridge 13 is made of titanium aluminum titanium three-layer composite metal or molybdenum aluminum molybdenum three-layer composite metal. The use of this three-layer structure cannot only prevent metal oxidation, but also can enhance the folding resistance of the touch sensing line.

In one illustration, widths of the first metal line 110, the second metal line 120 and the third metal line 130 are all within a range of 0.5 μm to 5 μm.

Figure 10:
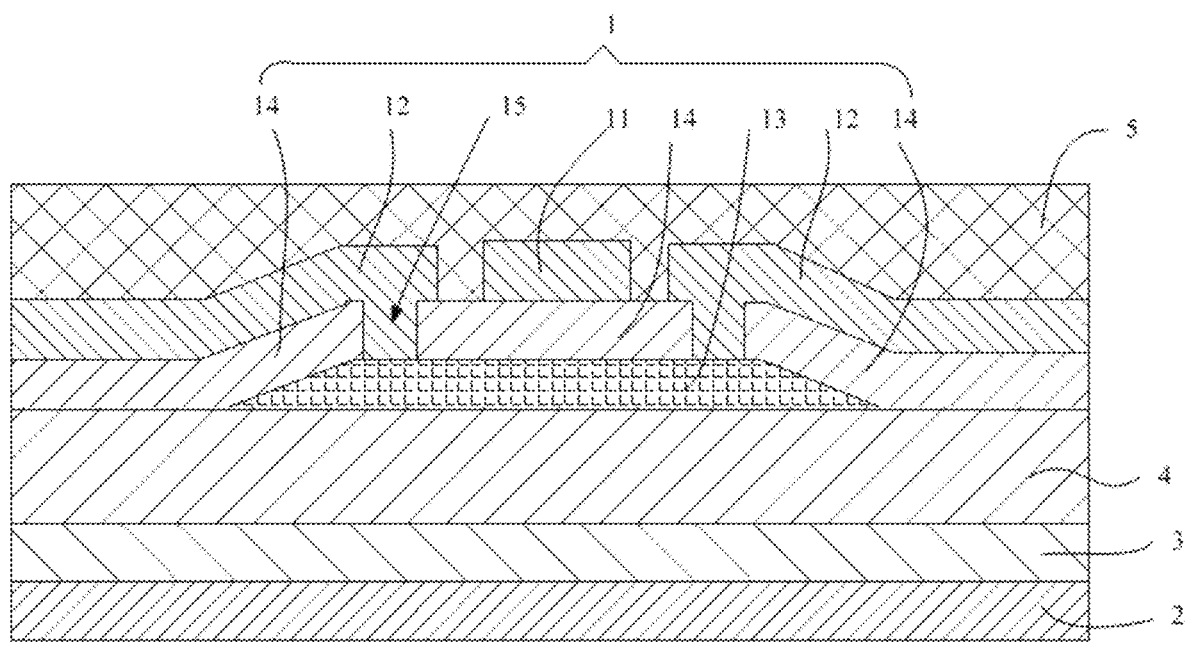
FIG. 10 is a structural diagram of one embodiment of an organic light emitting diode display panel according to the present invention.

Correspondingly, the present invention also provides an organic light emitting diode display panel as shown in FIG. 10. The organic light emitting diode display panel further comprises:

a substrate 2, an organic light emitting diode layer 3 disposed on the substrate 2 and an encapsulation layer 4 disposed above the organic light emitting diode layer 3; and a touch panel 1 disposed on the encapsulation layer 4;

a protective layer 5 disposed on the touch panel 1.

More specifically, the metal grid touch panel 1 comprises:

a first metal layer, forming a metal bridge 13;

an insulating layer 14 is disposed on the first metal layer; through holes 15 are formed in the insulating layer at two ends of the metal bridge 13;

a second metal layer is deposited on the insulating layer 14 and an encapsulation layer 4 and is etched for patterning to form the plurality of first touch electrode strings 11 and the plurality of second touch electrode strings 12, which are mutually intersected, wherein the adjacent second grid electrodes 121 in the second touch electrode strings 12 are electrically connected with the connecting bridge 13 with the aforesaid through hole 15.

For more details of the metal grid touch panel 1, referring to the foregoing descriptions of FIG. 3 to FIG. 9, and no further details are provided herein.

It can be understood that in the present invention, a metal grid touch sensing line is fabricated on the encapsulation layer of the flexible organic light emitting diode display panel, and the metal grid line is not positioned in the light emitting area of the pixel point, and is traced in the middle of the adjacent pixel points. At least one electrode of the driving electrode and the sensing electrode is connected and conducted with the metal grid bridge (bridge metal) thereunder, to realize a flexible touch panel and to reduce the thickness of the film by reducing the use of transparent optical adhesive.

The embodiment of the present invention has benefits below:

the metal grid touch panel and the organic light emitting diode display panel provided by the present invention can realize the On-Cell touch scheme of the flexible display touch control by forming the metal grid touch sensing line on the thin film encapsulation layer of the flexible organic light emitting diode display panel;

moreover, since the metal grid is used as the touch sensing circuit, the product can possess good bending resistance characteristics, and the metal grid lines are traced in the middle of adjacent pixel points, thereby minimizing the optical influence of the touch sensor on the organic light emitting diode;

meanwhile, since the lamination number of touch panel is effectively reduced, the thickness of the product can be effectively reduced while achieving flexible display touch control, and the production cost of the product is also reduced.

Incidentally, herein, relational terms such as first and second and the like are only used to distinguish one entity or operation from another entity or operation separate, without necessarily requiring or implying these entities or operations of between the presence of any such actual relationship or order. Further, the term "comprising", "containing" or any other variation thereof are intended to cover a non-exclusive inclusion, such that a process, method, article, article, or apparatus not include only those elements but not expressly listed further comprising the other elements, or further comprising such process, method, article, or apparatus inherent elements. Without more constraints, by the wording "include a" defined does not exclude the existence of additional identical elements in the element comprising a process, method, article, or apparatus.

Above are only specific embodiments of the present application, the scope of the present application is not limited to this, and to any persons who are skilled in the art, change or replacement which is easily derived should be covered by the protected scope of the application. Thus, the protected scope of the application should go by the subject claims.

What is claimed is:

1. A touch panel, comprising:
a plurality of first touch electrode strings arranged in a first direction, wherein each of the first touch electrode strings comprises a plurality of first grid electrodes which are electrically connected;
a plurality of second touch electrode strings in a same layer that intersect with the plurality of first touch electrode strings arranged in a second direction, wherein each of the second touch electrode strings comprises a plurality of second grid electrodes;
an insulating layer disposed on one side of the first touch electrode string and the second touch electrode string;
a bridge metal layer comprising at least one metal bridge;
wherein one side of the insulating layer is in contact with the first touch electrode string and the second touch electrode string, and an other side of the insulating layer is in contact with the bridge metal layer, and two adjacent second grid electrodes of the second touch electrode string are connected with the metal bridge with through holes disposed in the insulating layer;
wherein the first grid electrode comprises a plurality of first metal lines, and the second grid electrode comprises a plurality of second metal lines;
adjacent edges of the first grid electrode and the second grid electrode are staggered, and an electrical separation between the first touch electrode string and the second touch electrode string is achieved by a slight break between the first metal line and the adjacent second metal line.

2. The touch panel according to claim 1, wherein the metal bridge is a metal grid bridge formed by at least one third metal line, and the metal grid bridge is linear, X-shaped or double X-shaped as a whole.

3. The touch panel according to claim 2, wherein two ends of the metal bridge are respectively provided with a connecting portion, and the connecting portions are electrically connected to two adjacent second grid electrodes with the through holes provided in the insulating layer, respectively, and the connecting portions of the two ends of the metal bridge is thicker than adjacent third metal lines.

4. The touch panel according to claim 2, wherein staggered edges of the first touch electrode string and the second touch electrode string possess a pulsed edge or a zigzag edge.

5. The touch panel according to claim 4, wherein the first touch electrode string and the second touch electrode string are made of titanium aluminum titanium three-layer composite metal, and the metal bridge is made of titanium aluminum titanium three-layer composite metal or molybdenum aluminum molybdenum three-layer composite metal.

6. The touch panel according to claim 5, wherein the first grid electrode is one of a driving electrode and a sensing electrode, and the second grid electrode is an other of the driving electrode and the sensing electrode.

7. The touch panel according to claim 6, wherein the first metal line, the second metal line and the third metal line are all traced along a middle of adjacent pixel points, and widths thereof are all within a range of 0.5 µm to 5 µm.

8. The touch panel according to claim 7, wherein a diameter of the through hole does not exceed a distance of adjacent pixel points.

9. The touch panel according to claim 8, wherein a distance of the slight break between the first metal line and the second metal line is within a range of 3 µm to 20 µm.

10. An organic light emitting diode display panel, which comprises a substrate, an organic light emitting diode layer disposed on the substrate and an encapsulation layer disposed above the organic light emitting diode layer, further comprising:
a touch panel disposed on the encapsulation layer;
a protective layer disposed on the touch panel;
wherein the touch panel comprises:
a plurality of first touch electrode strings arranged in a first direction, wherein each of the first touch electrode strings comprises a plurality of first grid electrodes which are electrically connected;
a plurality of second touch electrode strings in a same layer that intersect with the plurality of first touch electrode strings arranged in a second direction, wherein each of the second touch electrode strings comprises a plurality of second grid electrodes;
an insulating layer disposed on one side of the first touch electrode string and the second touch electrode string;
a bridge metal layer comprising at least one metal bridge;
wherein one side of the insulating layer is in contact with the first touch electrode string and the second touch electrode string, and an other side of the insulating layer is in contact with the bridge metal layer, and two adjacent second grid electrodes of the second touch electrode string are connected with the metal bridge with through holes disposed in the insulating layer;
wherein the first grid electrode comprises a plurality of first metal lines, and the second grid electrode comprises a plurality of second metal lines;
adjacent edges of the first grid electrode and the second grid electrode are staggered, and an electrical separation between the first touch electrode string and the second touch electrode string is achieved by a slight break between the first metal line and the adjacent second metal line.

11. The organic light emitting diode display panel according to claim 10, wherein the metal bridge is a metal grid bridge formed by at least one third metal line, and the metal grid bridge is linear, X-shaped or double X-shaped as a whole.

12. The organic light emitting diode display panel according to claim 11, wherein two ends of the metal bridge are respectively provided with a connecting portion, and the connecting portions are electrically connected to two adjacent second grid electrodes with the through holes provided in the insulating layer, respectively, and the connecting portions of the two ends of the metal bridge is thicker than adjacent third metal lines.

13. The organic light emitting diode display panel according to claim 11, wherein staggered edges of the first touch electrode string and the second touch electrode string possess a pulsed edge or a zigzag edge.

14. The organic light emitting diode display panel according to claim 13, wherein the first touch electrode string and the second touch electrode string are made of titanium aluminum titanium three-layer composite metal, and the metal bridge is made of titanium aluminum titanium three-layer composite metal or molybdenum aluminum molybdenum three-layer composite metal.

15. The organic light emitting diode display panel according to claim 14, wherein the first grid electrode is one of a driving electrode and a sensing electrode, and the second grid electrode is an other of the driving electrode and the sensing electrode.

16. The organic light emitting diode display panel according to claim 15, wherein the first metal line, the second metal line and the third metal line are all traced along a middle of adjacent pixel points, and widths thereof are all within a range of 0.5 µm to 5 µm.

17. The organic light emitting diode display panel according to claim 16, wherein a diameter of the through hole does not exceed a distance of adjacent pixel points.

18. The organic light emitting diode display panel according to claim 17, wherein a distance of the slight break between the first metal line and the second metal line is within a range of 3 µm to 20 µm.

* * * * *